United States Patent
Sakai et al.

(10) Patent No.: US 8,614,147 B2
(45) Date of Patent: Dec. 24, 2013

(54) METHOD OF MANUFACTURING A SEMICONDUCTOR DEVICE

(75) Inventors: Masanori Sakai, Takaoka (JP); Tatsuyuki Saito, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 580 days.

(21) Appl. No.: 12/801,127

(22) Filed: May 24, 2010

(65) Prior Publication Data
US 2010/0304567 A1 Dec. 2, 2010

(30) Foreign Application Priority Data

May 28, 2009 (JP) ................................ 2009-128944
May 19, 2010 (JP) ................................ 2010-115334

(51) Int. Cl.
*H01L 21/443* (2006.01)
(52) U.S. Cl.
USPC ............... 438/680; 257/E21.17; 427/255.394
(58) Field of Classification Search
USPC .................. 427/255.394, 372.2; 438/680; 257/E21.17
See application file for complete search history.

(56) References Cited

U.S. PATENT DOCUMENTS

| | | | |
|---|---|---|---|
| 5,989,652 A | 11/1999 | Ameen et al. | |
| 6,080,444 A | 6/2000 | Shimizu et al. | |
| 8,314,021 B2 * | 11/2012 | Cho et al. | 438/589 |
| 2004/0029379 A1 | 2/2004 | Yamasaki et al. | |
| 2006/0234502 A1 * | 10/2006 | Bhat et al. | 438/656 |
| 2008/0317972 A1 | 12/2008 | Hendriks et al. | |
| 2009/0130331 A1 | 5/2009 | Asai et al. | |
| 2012/0080756 A1 * | 4/2012 | Suzuki et al. | 257/369 |

FOREIGN PATENT DOCUMENTS

| | | |
|---|---|---|
| JP | A-2001-508497 | 6/2001 |
| JP | A-2003-213418 | 7/2003 |
| JP | A-2009-4786 | 1/2009 |
| KR | 10-0393751 | 11/2003 |
| KR | 10-2006-0021940 | 3/2006 |
| KR | 10-2006-0118679 | 11/2006 |
| WO | WO 2007/020874 A1 | 2/2007 |

OTHER PUBLICATIONS

Office Action issued in Korean Patent Application No. 10-2010-0050619 dated Jul. 27, 2011 (with translation).
May 12, 2012 Korean Office Action issued in Patent Application No. 10-2010-0050619 (with translation).

* cited by examiner

*Primary Examiner* — Zandra Smith
*Assistant Examiner* — Toniae Thomas
(74) *Attorney, Agent, or Firm* — Oliff & Berridge, PLC

(57) ABSTRACT

A TiN film is formed by a first step of forming a TiN intermediate film on a wafer by supplying $TiCl_4$ and $NH_3$ reacting with $TiCl_4$ to the wafer and controlling a processing condition for causing a bonding branch that has not undergone a substitution reaction to remain at a predetermined concentration at a part of $TiCl_4$ and a second step of substituting the bonding branch contained in the TiN intermediate film by supplying $H_2$ to the wafer, the first step and the second step being performed in this order.

12 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device and a substrate processing apparatus and, particularly, to a method of manufacturing a semiconductor device including a step of forming a metal film on a substrate (wafer) and a substrate processing apparatus that forms a metal film on a substrate.

2. Description of the Related Art

As a method for forming a predetermined film on a substrate, a CVD (Chemical Vapor Deposition) method is known. The CVD method is a method for forming a film containing elements contained in molecules of the raw material in two or more materials as components on a substrate by utilizing a reaction between the materials in a vapor phase or on a surface of the substrate. An ALD (Atomic Layer Deposition) method is one of the CVD methods. The ALD method is a method for forming a film that is controlled at an atomic layer level by utilizing a surface reaction by supplying two or more materials for the film formation alternately and one by one onto the substrate to cause the material to be deposited by the unit of the atomic layer. The ALD method enables processing at a substrate temperature (processing temperature) lower than that of the conventional CVD method and control of a thickness of the film to be formed depending on the number of film formation cycles. Though the ALD method generally includes a so-called incubation time that is an initial period of time in the film formation cycle during which the film is nor formed, the ALD method has a proportional relation (linearity) between the number of film formation cycles and the film formation amount after a certain number of cycles.

Examples of the metal film to be formed on the substrate include a TiN (titanium nitride) film as described in Patent Publication 1.

Patent Publication 1: WO2007/020874

SUMMARY OF THE INVENTION

However, though it is possible to form a continuous film of the TiN film by the CVD method or the ALD method, components of the materials are sometimes contained in the film as impurities after the film formation. For example, in the case of using $TiCl_4$ (titanium tetrachloride) as the material containing titanium (Ti), chlorine (Cl) remains in the film to sometimes cause a side effect such as an increase in film resistance. Though it is possible to alleviate the side effect by adapting the ALD method or increasing a film formation temperature, it has been difficult to control the residual substance such as chlorine.

Therefore, a major object of the present invention is to provide a method of manufacturing a semiconductor device and a substrate processing apparatus that are capable of solving the above-described problem, controlling easily a composition of a metal compound film, and forming a high quality film meeting a usage and form a high performance film having a low contact resistance by forming a bonding with a base layer.

According to one aspect of the present invention in order to solve the above-described problem, there is provided a method of manufacturing a semiconductor device for forming a metal film, including a first step of forming a metal intermediate film on a substrate by supplying a Cl-containing metal compound and a reactive gas reacting with the Cl-containing metal compound to the substrate and controlling a processing condition for causing a bonding branch that has not undergone a substitution reaction to remain at a predetermined concentration at a part of the Cl-containing metal compound and a second step of substituting the bonding branch contained in the metal intermediate film by supplying $H_2$ to the substrate, the first step and the second step being performed in this order.

According to another aspect of the present invention, there is provided a substrate processing apparatus including a processing chamber that houses a substrate, a heating system that heats the substrate, a first gas supply system that supplies a metal compound to the processing chamber, a second gas supply system that supplies a reactive gas reacting with the metal compound to the processing chamber, a third gas supply system that supplies $H_2$ to the processing chamber, an evacuation system that evacuates an atmosphere in the processing chamber, and a control unit that controls the heating system, the first gas supply system, the second gas supply system, the third gas supply system, and the evacuation system, the control unit performs control for forming a metal film by exposing the substrate to the metal compound and the reactive gas while heating the substrate to form a metal intermediate film in which a bonding branch that has not undergone a substitution reaction is caused to remain at a predetermined concentration at a part of the metal compound and subsequently exposing the substrate to $H_2$ for substituting the bonding branch contained in the metal intermediate film.

DESCRIPTION OF THE PREFERRED EMBODIMENTS

Hereinafter, preferred embodiments of the present invention will be described with reference to the drawings.

A substrate processing apparatus according to the present embodiment is structured as one example of a semiconductor production apparatus to be used for producing a semiconductor device [IC (integrated circuit)]. In the following description, a case of using a vertical apparatus for performing a film formation processing and the like on a substrate is described as one example of the substrate processing apparatus. However, the present invention is not premised on the use of the vertical apparatus, and a single wafer apparatus, for example, may be used.

<Structure of Entire Apparatus>

Figure 1:
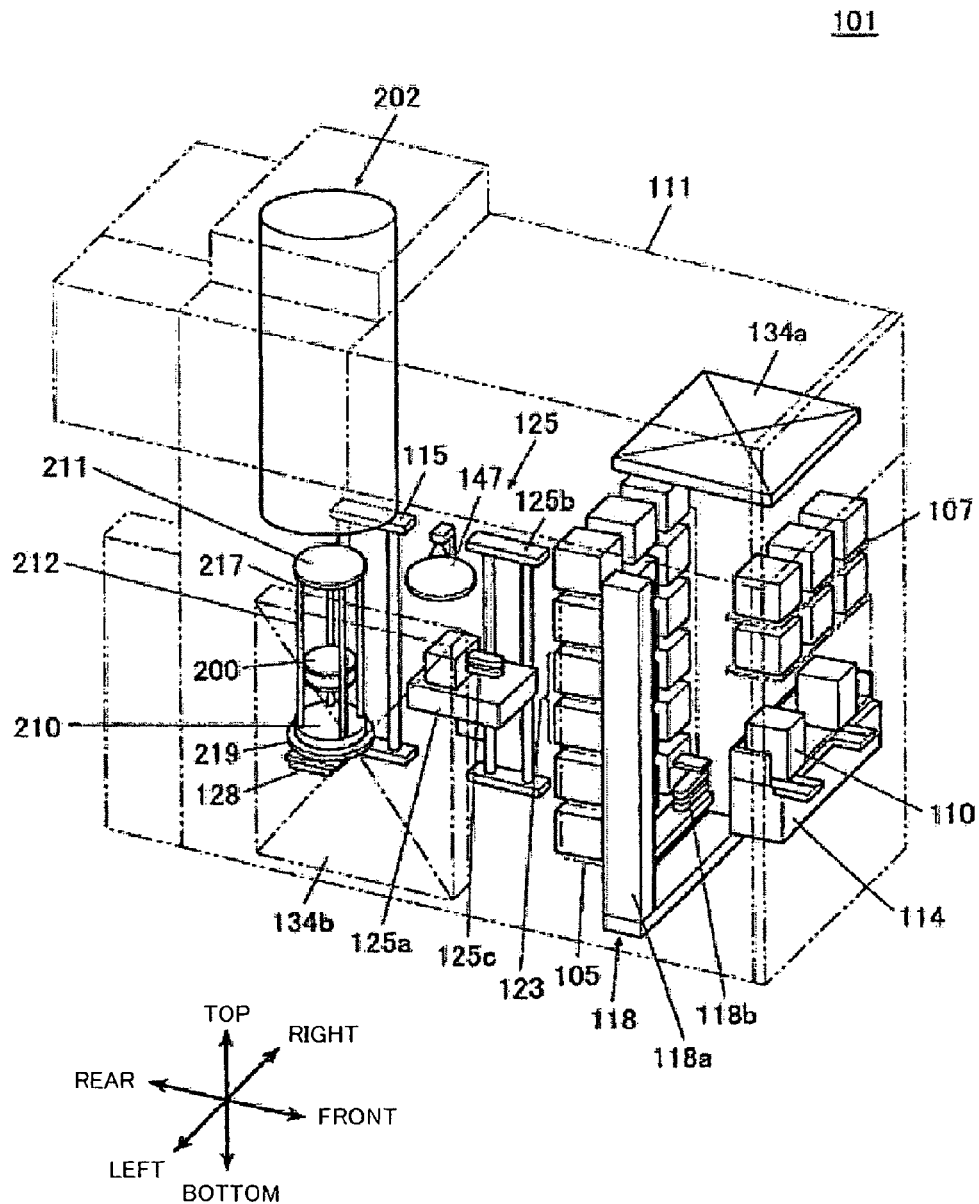
FIG. 1 is a perspective view showing a schematic structure of a substrate processing apparatus to be suitably used in one embodiment of the present invention.

As shown in FIG. 1, a cassette 110 housing a wafer 200 which is one example of a substrate is used in a substrate processing apparatus 101, and the wafer 200 is formed of a material such as silicon. The substrate processing apparatus 101 is provided with a housing 111, and a cassette stage 114 is disposed inside the housing 111. The cassette 110 is conveyed onto and out from the cassette stage 114 by an in-process conveying device (not shown).

The cassette stage 114 is placed in such a manner that the wafer 200 maintains an upright posture inside the cassette 110 and a wafer gate of the cassette 110 is oriented upward by the in-process conveying device. The cassette stage 114 is so structured as to be capable of operating in such a manner as to: rotate the cassette 110 clockwise by 90 degrees in a vertical direction toward the rear of the housing 111: cause the wafer 200 to maintain a horizontal posture in the cassette 110, and orient the wafer gate of the cassette 110 to the rear of the housing 111.

A cassette rack 105 which is disposed at a substantially central part in a longitudinal direction of the housing 111 is so structured as to store a plurality of cassettes 110 in the form of a plurality of stages and a plurality of tiers. The cassette rack 105 is provided with a transfer rack 123 in which the cassette 110 to be conveyed by a wafer transfer mechanism 125 is housed.

A preliminary cassette rack 107 which is provided above the cassette stage 114 is so structured as to preliminarily store the cassette 110.

A cassette conveying device 118 is provided between the cassette stage 114 and the cassette rack 105. The cassette conveying device 118 is formed of a cassette elevator 118a capable of moving upward and downward while retaining the cassette 110 and a cassette conveying mechanism 118b serving as a conveying mechanism. The cassette conveying device 118 has such a structure that the cassette 110 is conveyed among the cassette stage 114, the cassette rack 105, and the preliminary cassette rack 107 by a continuous operation of the cassette elevator 118a and the cassette conveying mechanism 118b.

The wafer transfer mechanism 125 is provided at the rear of the cassette rack 105. The wafer transfer mechanism 125 is formed of a wafer transfer device 125a capable of rotating in the horizontal direction and linearly moving the wafer 200 and a wafer transfer device elevator 125b for moving the wafer transfer device 125a upward and downward. The wafer transfer device 125a is provided with tweezers 125c for picking up the wafer 200. The wafer transfer mechanism 125 is so structured as to charge (charging) and discharge (discharging) the wafer 200 to and from a boat 217 by using the tweezers 125c as a table unit for the wafer 200 by a continuous operation of the wafer transfer device 125a and the wafer transfer device elevator 125b.

A processing furnace 202 that performs heat treatment on the wafer 200 is provided at the rear of and above the housing 111, and the processing furnace 202 has a structure that a lower end part is opened and closed by a furnace opening shutter 147.

A boat elevator 115 that moves the boat 217 upward and downward with respect to the processing furnace 202 is provided below the processing furnace 202. An arm 128 is connected to an elevating table of the boat elevator 115, and a sealing cap 219 is horizontally fixed to the arm 128. The sealing cap 219 is so structured as to vertically support the boat 217 and to be capable of closing the lower end part of the processing furnace 202.

The boat 217 is provided with a plurality of holding members and so structured as to horizontally hold each of a plurality of wafers 200 (e.g. 50 to 150 wafers) in a state where the wafers 200 are lined up in the vertical direction with centers thereof being aligned with one another.

A clean unit 134a that supplies a clean air which is a cleaned atmosphere is provided above the cassette rack 105. The clean unit 134a is formed of a supply fan and a dust-tight filter and is so structured as to circulate the clean air inside the housing 111.

A clean unit 134b for supplying a clean air is provided at a left end part of the housing 111. The clean unit 134b is also formed of a supply fan and a dust-tight filter and so structured as to circulate the clean air in the vicinity of the wafer transfer device 125a, the boat 217, and the like. The clean air is evacuated to the outside of the housing 111 after circulating in the vicinity of the wafer transfer device 125a, the boat 217, and the like.

<Operation of Processing Apparatus>

Hereinafter, a major operation of the substrate processing apparatus 101 will be described.

When the cassette 110 is conveyed onto the cassette stage 114 by the in-process conveying device (not shown), the cassette 110 is placed in such a manner that the wafer 200 maintains an upright posture inside the cassette 110 and a wafer gate of the cassette 110 is oriented upward. After that, the cassette 110 is rotated clockwise by 90 degrees in a vertical direction toward the rear of the housing 111 by the cassette stage 114 in such a manner as to cause the wafer 200 to maintain a horizontal posture in the cassette 110 and to orient the wafer gate of the cassette 110 to the rear of the housing 111.

After that, the cassette 110 is automatically conveyed and transferred to a designated rack position of the cassette rack 105 or the preliminary cassette rack 107 by the cassette conveying device 118 and, after a temporary storage, transferred from the cassette rack 105 or the preliminary cassette rack 107 to the transfer rack 123 by the cassette conveying device 118 or directly transferred to the transfer rack 123.

When the cassette 110 is transferred to the transfer rack 123, the wafer 200 is picked up by the tweezers 125c of the wafer transfer device 125a from the cassette 110 via the wafer gate to be charged onto the boat 217 (charging). The wafer transfer device 125a that transferred the wafer 200 to the boat 217 returns to the cassette 110 to charge subsequent wafer 110 onto the boat 217.

When a preliminarily designated number of wafers 200 are charged onto the boat 217, the furnace opening shutter 147 that closes the lower end part of the processing furnace 202 is opened to open the lower end part of the processing furnace 202. After that, the boat 217 holding the wafers 200 is conveyed into (loading) the processing furnace 202 by a rising operation of the boat elevator 115, and the lower part of the processing furnace 202 is closed by the sealing cap 219.

After the loading, an arbitrary processing is performed on the wafers 200 by the processing furnace 202. After the processing, the wafers 200 and the cassette 110 are conveyed outside the housing 111 by a procedure reverse to the above-described procedure.

<Structure of Processing Furnace>

The processing furnace 202 to be applied to the substrate processing apparatus described above will be described by using FIG. 2 and FIG. 3.

Figure 2:
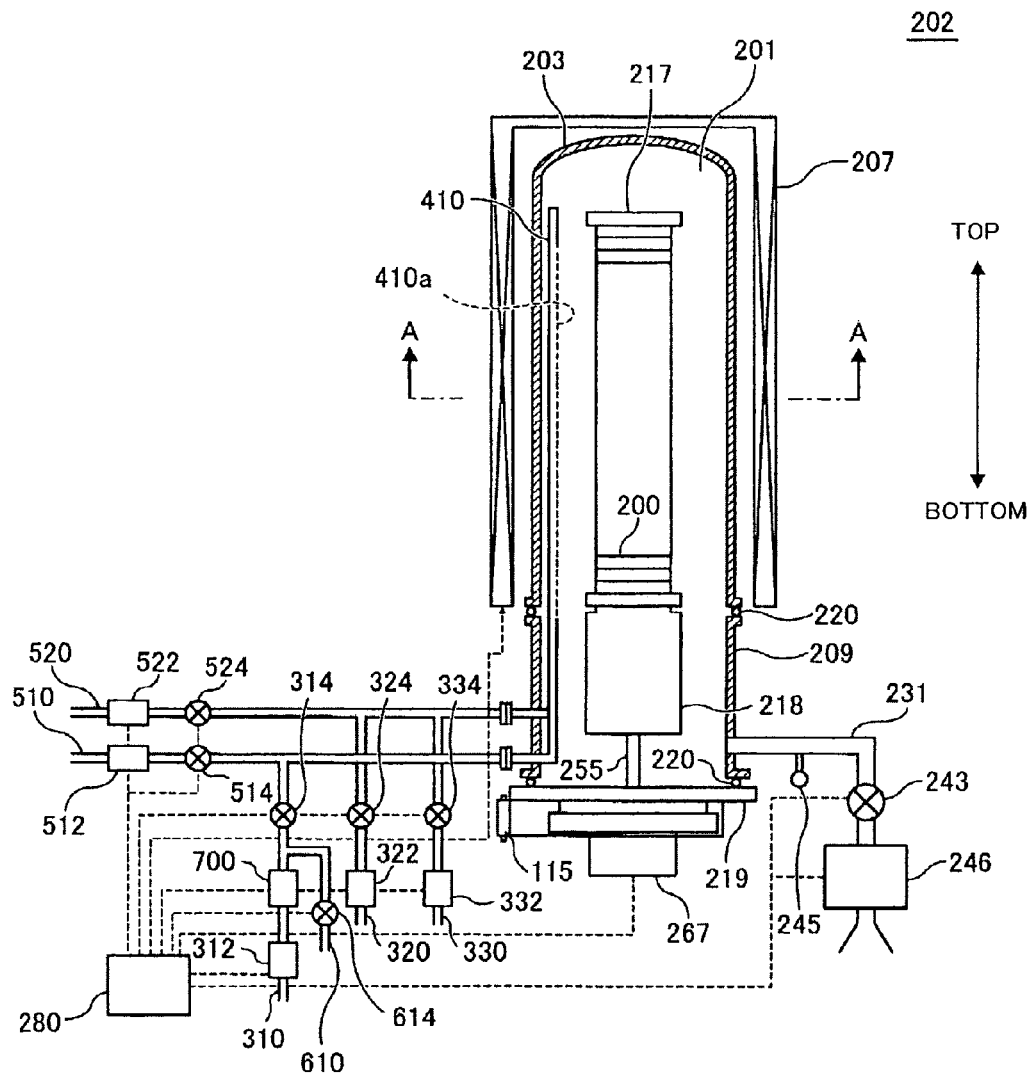
FIG. 2 is a schematic block diagram showing one example of a processing furnace and accompanying members to be suitably used in one embodiment of the present invention, in particular, a vertical section of the processing furnace part.
Figure 3:
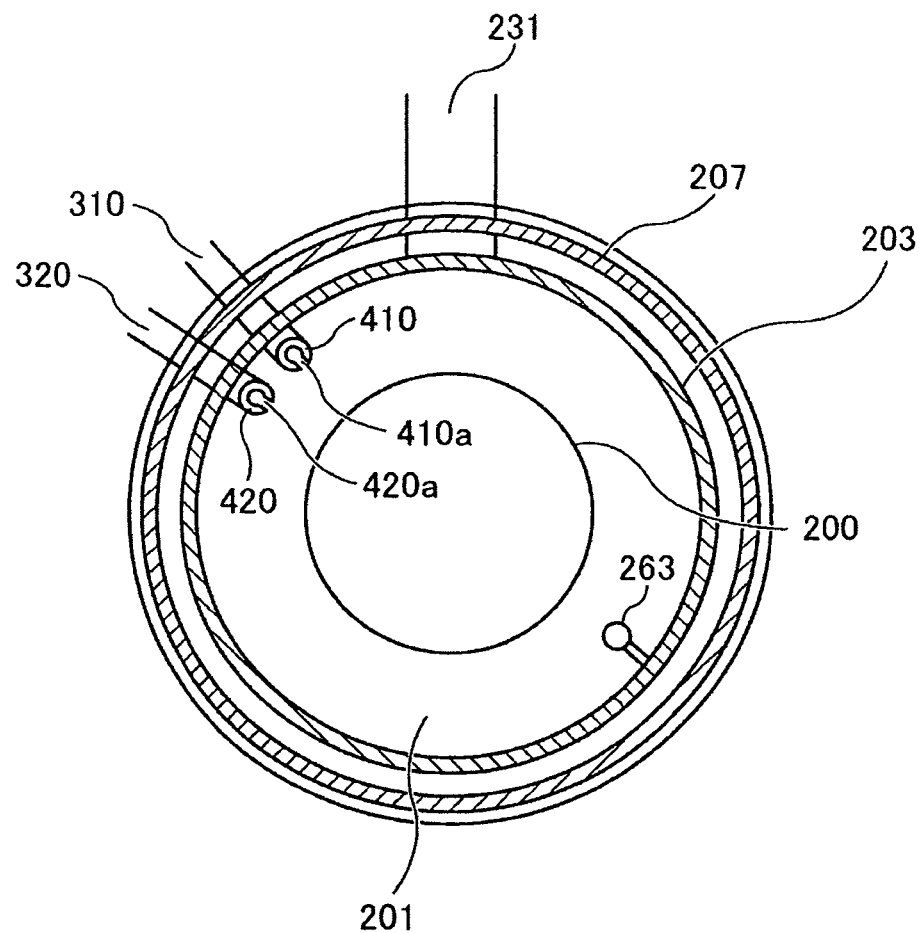
FIG. 3 is a sectional view showing the processing furnace to be suitably used in one embodiment of the present invention shown in FIG. 2 and taken along a line A-A of FIG. 2.

As shown in FIG. 2 and FIG. 3, the processing furnace 202 is provided with a heater 207 that is a heating device (heating unit, heating means) for heating the wafer 200. The heater 207 is provided with a cylindrical heat insulating member of which an upper part is closed and a plurality of heater wirings and has a unit structure wherein the heat insulating member is provided with the heater wirings. A reaction tube 203 made from quartz for processing the wafer 200 is provided inside the heater 207.

A sealing cap 219 that can close a lower end opening of the reaction tube 203 to air-tightly is provided below the reaction tube 203. The sealing cap 219 touches a lower end of the reaction tube 203 from the lower side of the vertical direction. The sealing cap 219 is composed of metal such as stainless for instance, formed discoid. An O-ring 220 serving as a sealing material that touches a lower end of the reaction tube 203 is provided on the sealing cap 219. A boat rotation mechanism 267 is provided on the opposite side of the processing chamber 201 against the sealing cap 209. A rotation shaft 255 of the rotation mechanism 267 is connected to the boat 217, and the boat rotation 267 is so structured as to rotate the wafers 200 by rotating the boat 217. The sealing cap 219 is so structured as to be moved up and down by a boat elevator 115 serving as a moving up and down mechanism provided outside of the reaction tube 203, and can convey the boat 217 onto and out from the processing chamber 201.

The sealing cap 219 is provided with a boat support table 218 that supports the boat 217. As shown in FIG. 1, the boat 217 has a bottom plate 210 fixed to the boat support table 218 and a top plate 211 fixed above the bottom plate 210, and has a structure wherein a plurality of columns 212 are provided between the bottom plate 210 and the top plate 211. A plurality of wafers 200 are held on the boat 217. The plurality of wafers 200 are supported by the columns 212 of the boat 217 in a state of maintaining the horizontal posture with a constant clearance being defined between the adjacent wafers 200.

In the processing furnace 202 described above, the boat 217 is inserted into the processing chamber 201 while being supported by the boat support 218 in a state where the plurality of wafers 200 to be subjected to a batch processing are layered in a multiple of stages, and the heater 207 heats the wafers 200 inserted into the processing chamber 201 to a predetermined temperature.

As shown in FIG. 2 and FIG. 3, two gas supply pipings 310 and 320 (first gas supply piping 310, second gas supply piping 320) for supplying a raw material gas are connected to the processing chamber 201.

The gas supply piping 310 is provided with a mass flow controller 312 serving as a flow rate control device (flow rate control means), a vaporizer 700 serving as a vaporizing unit (vaporizing means), and a valve 314 serving as an open/close valve in this order from an upstream side. A nozzle 410 (first nozzle 410) is connected to a leading end of the gas supply piping 310. The nozzle 410 is a circular space between an inner wall of the reaction tube 203 forming the processing chamber 201 and the wafer 200 and extends in the vertical direction (loading direction of the wafers 200) along the inner wall of the reaction tube 203. A multiple of gas supply openings 410a for supplying the raw material gas are provided on a lateral surface of the nozzle 410. The gas supplying openings 410a have an identical opening area or opening areas that are gradually changed from a lower part to an upper part and are provided at an identical opening pitch.

The gas supply piping 310 is provided with a vent line 61 connected to an evacuation piping 231 described later in this specification and a valve 614 between the vaporizer 700 and the valve 314, and the raw material gas is supplied to the vent line 610 via the valve 614 in the case of not supplying the raw material gas to the processing chamber 201. A first gas supply system (a first gas supply means) is mainly composed by the gas supply piping 310, the mass flow controller 312, the Vaporizer 700, the valve 314, the nozzle 410, the vent line 610, and the valve 614.

A carrier gas supply piping 510 for supplying a carrier gas is connected to the gas supply piping 310. The carrier gas supply piping 510 is provided with a mass flow controller 512 and a valve 514. A first carrier gas supply system (an inert gas supply system, an inert supply means) is mainly composed by the carrier gas supply piping 510, the mass flow controller 512, and the valve 514.

The gas supply piping 320 is provided with a mass flow controller 322 serving as a flow rate control device (flow rate control means) and a valve 324 serving as an open/close valve in this order from an upstream side. A nozzle 420 (second nozzle 420) is connected to a leading end of the gas supply piping 320. The nozzle 420, like the nozzle 410, is a circular space between an inner wall of the reaction tube 203 forming the processing chamber 201 and the wafer 200 and extends in the vertical direction (loading direction of the wafers 200) along the inner wall of the reaction tube 203. A multiple of gas supply openings 420a for supplying the raw material gas are provided on a lateral surface of the nozzle 420. The gas supplying openings 420a, like the gas supplying openings 410a, have an identical opening area or opening areas that are gradually changed from a lower part to an upper part and are provided at an identical opening pitch. A second gas supply system (a second gas supply means) is mainly composed by the gas supply piping 320, the mass flow controller 322, the valve 324, and the nozzle 420.

A carrier gas supply piping 520 for supplying a carrier gas is connected to the gas supply piping 320. The carrier gas supply piping 520 is provided with a mass flow controller 522 and a valve 524. A second carrier gas supply system (an inert gas supply system, an inert supply means) is mainly composed by the carrier gas supply piping 520, the mass flow controller 522, and the valve 524.

A gas supply piping 330 is connected to the gas supply piping 320. The gas supply piping 330 is provided with a mass flow controller 332 and a valve 334. A third gas supply system (a third gas supply means) is mainly composed by the gas supply piping 330, the mass flow controller 332, the valve 334, and the nozzle 420.

For example, in the case where the raw material supplied from the gas supply piping 310 is a liquid, the reaction gas is supplied from the gas supply piping 310 to the processing chamber 201 after joining with the carrier gas supply piping 510 via the mass flow controller 312, the vaporizer 700, and the valve 314 and further via the nozzle 410. For example, in the case where the raw material supplied from the gas supply piping 310 is a gas, the mass flow controller 312 is replaced by a mass flow controller for gas, and the vaporizer 700 is not required. Also, the reaction gas is supplied from the gas supply piping 320 to the processing chamber 201 after joining with the carrier gas supply piping 520 via the mass flow controller 322 and the valve 324 and further via the nozzle 420.

As one example according to the above-described structure, a chlorine-based Ti-containing material (a Chlorine-containing metal compound) [titanium tetrachloride ($TiCl_4$)] or the like is introduced into the gas supply piping 310 as one example of the raw material gas. An ammonium ($NH_3$), nitrogen ($N_2$), nitrous oxide ($N_2O$), monomethylhydrazine ($CH_6N_2$) or the like is introduced into the gas supply piping 320 as one example of a modifying material. A hydrogen gas is introduced into the gas supply piping 330 as a hydrogen-containing gas. The carrier supply pipings 510, 520 supply a nitrogen ($N_2$) to the processing chamber 210 respectively via the mass flow controllers 512, 522, the valves 514, 524, and the nozzles 410, 420.

When the gas like above-described is supplied from each the gas supply pipings, a raw material gas supply system, that is, Cl-containing metal compound supply system is composed by the first gas supply system. A reforming material gas (a reactive gas, a N-containing gas) supply system is composed by the second gas supply system. A H-containing gas (a hydrogen gas) supply system is composed by the third gas supply system.

The reaction tube 203 is provided with the exhaust tube 231 that exhausts an atmosphere in the processing chamber 201. A pressure sensor 245 serving as a pressure detector (pressure detection portion) that detects an internal pressure of the processing chamber 201 is connected to the evacuation piping 231. Also, a vacuum pump 246 serving as a vacuum exhauster is connected to the evacuation piping 231 via an APC (Auto Pressure Controller) valve 243 serving as a pressure adjustor (pressure adjustment portion). The reaction tube 203 is thus configured to be evacuated until the internal pressure of the processing chamber 201 reaches a predetermined pressure (degree of vacuum). The APC valve 243 is an on-off valve capable of evacuating the processing chamber 201 and stopping evacuation by opening and closing the valve and further capable of adjusting a pressure by regulating the valve opening degree. An exhaust system is chiefly formed of the evacuation piping 231, the APC valve 243, the vacuum pump 246, and the pressure sensor 245.

The reaction tube 203 is provided with a temperature sensor 263 serving as a temperature detector (a temperature detection unit), and the processing chamber 201 is so structured as to become predetermined temperature distribution because of adjusting energization condition based on temperature information detected by the temperature sensor 263. The temperature sensor 263 is formed to 'L' character type, and provided along the inner wall of the reaction tube 203.

The boat 217 is provided inside the reaction tube 203 at a central part of the reaction tube 203. The boat 217 is capable of moving up and down (moving in and out) the reaction tube 203 by the boat elevator 115. The boat rotation mechanism 267 for rotating the boat 217 is provided at a lower end part of the boat support table 218 supporting the boat 217 for the purpose of improving uniformity of processing. It is possible to rotate the boat 217 supported by the boat support table 218 by driving the boat rotation mechanism 267.

The above-described members such as the mass flow controllers 312, 322, 332, 512, 522, and 332, the valves 314, 324, 514, 524, 334, 243, and 614, the heater 207, the temperature sensor 263, the pressure sensor 245, the APC valve 243, the vacuum pump 246, the boat rotation mechanism 267, and the boat elevator 115 are connected to a controller 280. The controller 280 is one example of a control unit (control means) that controls an entire operation of the substrate processing apparatus 101 and controls flow rate adjustments of the mass flow controllers 312, 322, 332, 512, 522, and 332, open/close operations of the valves 314, 324, 514, 524, 334, and 614, open/close operation and pressure adjustment operation of the APC valve 243, temperature adjustment of the heater 207 based on the temperature sensor 263, start and stop of the vacuum pump 246, rotation speed adjustment of the boat rotation mechanism 267, elevating operation of the boat elevator 115, and the like, respectively.

<Semiconductor Device Production Method>

Hereinafter, one example of a method of forming an insulating film on a substrate in the case of producing a large scale integration (LSI) as one of semiconductor device production steps by using the processing furnace 202 of the above-described substrate processing apparatus will be described. In the following description, operations of the units forming the substrate processing apparatus are controlled by the controller 280.

First Embodiment

In the present embodiment, a method of forming a TiN film as a metal compound film by employing the ALD method will be described. One example of forming a TiN film (including TiNH film having a Ti—N—H group in some cases) on a substrate by forming a TiN intermediate film on the substrate while causing a bonding branch that has not undergone a substitution reaction to partially remain by using $TiCl_4$ that is Ti-containing material as a Cl-containing material compound and $NH_3$ as a nitriding gas (a reactive gas that reacts with $TiCl_4$) for substituting $TiCl_4$ and, subsequently, causing hydrogen to react with the bonding branch will be described. In this example, a raw material gas supply system, that is, Cl-containing metal compound supply system (a first element containing gas supply system) is composed by the first gas supply system, a r N-containing gas supply system (a second element containing gas supply system) is composed by the second gas supply system.

The ALD method is a method for forming a film by utilizing a surface reaction by supplying at least two raw material gases used for the film formation alternately and one by one onto the substrate under certain film formation conditions (temperature, time, etc.) to cause the material gases to be deposited on the substrate by an atomic unit. In this case, a control of a film thickness is performed by way of the number of cycles for supplying the raw material gases (for instance, in the case where a film formation speed is one angstrom/cycle, 20 cycles are performed for forming a film of 20 angstroms).

Figure 4:
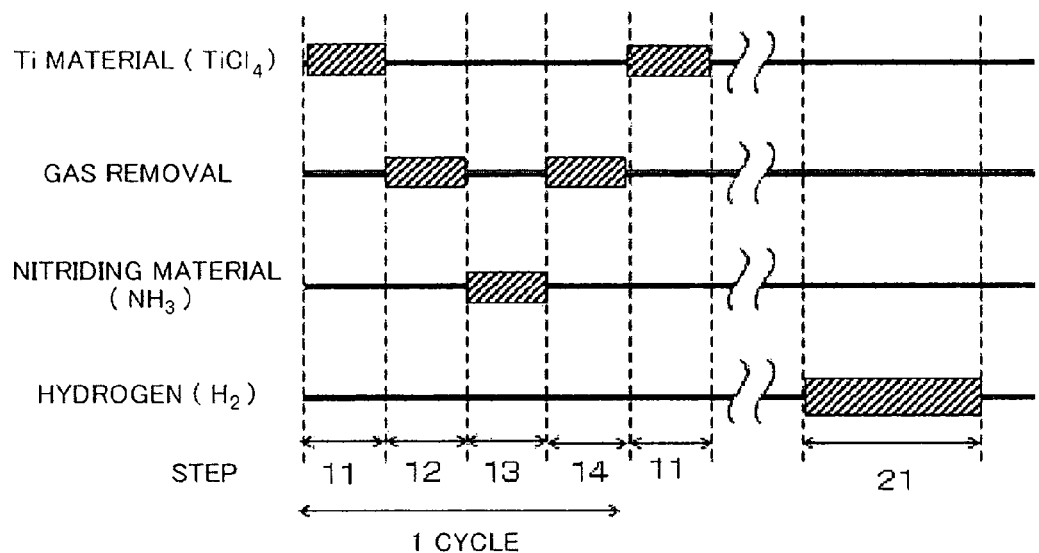
FIG. 4 is a diagram showing a film formation sequence of a TiN film according to a first embodiment of the present invention.

Shown in FIG. 4 is a film formation sequence for forming the TiN film according to the present embodiment. During the film formation process, the controller 280 controls the substrate processing apparatus 101 in the manner described below. More specifically, the controller 280 controls the heater 207 to maintain a temperature inside the processing chamber 201 within a range of 300° C. to 550° C., e.g., 450° C.

In the case where the temperature inside the processing chamber 201 is higher than 550° C., the raw materials supplied to the processing chamber 201 are heat-decomposed to make it difficult to ensure in-plane uniformity. In the case where the temperature inside the processing chamber 201 is lower than 300° C., impurities remaining in the film to be formed are increased.

After that, a plurality of wafers 200 are mounted on the boat 217, and the boat 217 is conveyed into the processing chamber 201 by the boat elevator 215. After that, the boat 217 is rotated by the boat driving mechanism 267 to rotate the wafers 200. After that, the APC valve 243 is opened simultaneously with activating the vacuum pump 246 to evacuate the processing chamber 201, and, when a temperature of the wafers 200 reaches to 450° C. and the temperature and the like become stable, 5 steps are executed in the manner described below in a state where the temperature inside the processing chamber 201 is maintained to 450° C.

(Step 11)

In Step 11, TiCl$_4$ is flown. TiCl$_4$ is in the form of a liquid at an ordinary temperature, and for supplying TiCl$_4$ to the processing chamber 201, a method of supplying after evaporation by heating, a method of passing an inert gas such as He (helium), Ne (neon), Ar (argon), N$_2$ (nitrogen), which is called a carrier gas through a TiCl$_4$ container by using the vaporizer 700 and supplying the vaporized portion to the processing chamber 201 together with the carrier gas, and the like are considered. As one example, the later case will be described.

TiCl$_4$ is flown through the gas supply piping 310, and a carrier gas (N$_2$) is flown through the carrier gas supply piping 510. The valve 314 of the gas supply piping 310, the valve 512 of the carrier gas supply piping 510, and the APC valve 243 of the evacuation piping 231 are simultaneously opened. The carrier gas is flown through the carrier gas supply piping 510, and a flow rate thereof is adjusted by the mass flow controller 512. TiCl$_4$ is flown though the gas supply piping 310, and a flow rate thereof is adjusted by the mass flow controller 312. TiCl$_4$ is vaporized by the vaporizer 700 and mixed with the flow rate adjusted-carrier gas, followed by evacuation through the evacuation piping 231 while being supplied to the processing chamber 201 through the gas supply openings 410a of the nozzle 410. In this case, the APC valve 243 is appropriately adjusted to maintain a pressure inside the processing chamber 201 within a range of 20 to 50 Pa, e.g. 30 Pa.

A supply amount of TiCl$_4$ controlled by the mass flow controller 312 is 1.0 to 2.0 g/min. In the case where the TiCl$_4$ supply amount is more than 2.0 g/min, such supply amount results in excessive supply that exceeds a supply amount to be consumed for the film formation. In the case where the TiCl$_4$ supply amount is less than 1.0 g/min, the in-plane uniformity is deteriorated as compared to the case wherein the supply amount is within the above-specified range.

A time period for exposing the wafer 200 to TiCl$_4$ is 3 to 10 seconds. In the case where the time period for exposing the wafer 200 to TiCl$_4$ is longer than 10 seconds, productivity is reduced to make bulk production difficult. In the case where the time period for exposing the wafer 200 to TiCl$_4$ is shorter than 3 seconds, the in-plane uniformity is deteriorated as compared to the case wherein the exposure time is within the above-specified range.

The temperature of the heater 207 is so set as to keep the temperature of the wafer 200 within a range of 300° C. to 550° C., e.g. 450° C.

The gases flown to the processing chamber 201 are TiCl$_4$ and the inert gas such as N$_2$ and Ar, and NH$_3$ is not present. Therefore, TiCl$_4$ does not cause a vapor phase reaction but is brought into a surface reaction (chemical deposition) with a surface of the wafer 200 or a base film to form a deposition layer of the material (TiCl$_4$) or a Ti layer (hereinafter Ti-containing layer). The TiCl$_4$ deposition layer includes a continuous deposition layer and also a discontinuous deposition layer of the material molecules. The Ti layer includes a continuous layer formed of Ti and a Ti thin film formed by overlapping of the continuous Ti layers. The continuous layer formed of Ti is in some cases referred to as a Ti thin film.

It is possible to prevent TiCl$_4$ from flowing to the NH$_3$ side by flowing an inert gas from the carrier gas supply piping 520 connected to an intermediate part of the gas supply piping 320 by simultaneously opening the valve 524.

(Step 12)

The valve 314 of the gas supply piping 310 is closed to stop the TiCl$_4$ supply to the processing chamber, and the valve 614 is opened to flow TiCl$_4$ to the vent line 610. With such operation, it is possible to always stably supply TiCl$_4$ to the processing chamber. In this case, the APC valve 243 of the gas evacuation piping 231 is left open to evacuate the processing chamber 201 to 20 Pa or less by the vacuum pump 246, thereby releasing remaining TiCl$_4$ from the processing chamber 201. In this case, it is possible to enhance the effect of releasing the residual TiCl$_4$ by supplying the inert gas such as N$_2$ to the processing chamber 201.

(Step 13)

In Step 13, NH$_3$ is flown. NH$_3$ is flown through the gas supply piping 320, and the carrier gas (N$_2$) is flown through the carrier gas supply piping 520. The valve 324 of the gas supply piping 320, the valve 522 of the carrier gas supply piping 520, and the APC valve 243 of the evacuation piping 231 are simultaneously opened. The carrier gas is flown through the carrier gas supply piping 520, and a flow rate thereof is adjusted by the mass flow controller 522. NH$_3$ is flown though the gas supply piping 320, and a flow rate thereof is adjusted by the mass flow controller 322. NH$_3$ is mixed with the flow rate adjusted-carrier gas, followed by evacuation through the evacuation piping 231 while being supplied to the processing chamber 201 through the gas supply openings 420a of the nozzle 420. In the case of flowing NH$_3$, the APC valve 243 is appropriately adjusted to maintain a pressure inside the processing chamber 201 within a range of 50 to 1000 Pa, e.g. 60 Pa.

A supply amount of NH$_3$ controlled by the mass flow controller 324 is 1 to 10 slm. In the case where the NH$_3$ supply amount is more than 10 slm, such supply amount results in excessive supply that exceeds a supply amount to be consumed for the film formation. In the case where the NH$_3$ supply amount is less than 1 slm, the in-plane uniformity is deteriorated as compared to the case wherein the supply amount is within the above-specified range.

A time period for exposing the wafer 200 to NH$_3$ is 10 to 30 seconds. In the case where the time period for exposing the wafer 200 to NH$_3$ is longer than 30 seconds, productivity is reduced to make bulk production difficult. In the case where the time period for exposing the wafer 200 to NH$_3$ is shorter than 10 seconds, the in-plane uniformity is deteriorated as compared to the case wherein the exposure time is within the above-specified range.

The temperature of the heater 207 is so set as to keep the temperature of the wafer 200 within a range of 300° C. to 550° C., e.g. 450° C., which is the same as that of Step 11.

It is possible to prevent NH$_3$ from flowing to the TiCl$_4$ side by flowing the inert gas from the carrier gas supply piping 510 connected to a part of the gas supply piping 310 by simultaneously opening the valve 514.

By the supply of NH$_3$, a surface reaction (chemical deposition) between the Ti-containing layer chemically deposited on the wafer 200 and NH$_3$ is caused to form a TiN intermediate film on the wafer 200. Here, remaining branches of Ti and Cl that have not undergone a substitution reaction remain on the formed TiN film.

(Step 14)

In Step 14, the valve 324 of the gas supply piping 320 is closed to stop the NH$_3$ supply. Also, the APC valve 243 of the gas evacuation piping 231 is left open, and the processing chamber 201 is evacuated to 20 Pa or less by the vacuum pump 246, thereby releasing residual NH$_3$ from the processing chamber 201. In this case, it is possible to further enhance the effect of releasing the residual NH$_3$ by performing purging by supplying an inert gas such as N$_2$ from each of the gas supply piping 320 serving as the NH$_3$ supply line and the gas supply piping 310 serving as the TiCl$_4$ supply line to the processing chamber 201.

In the case where one cycle is constituted of the above-described Steps 11 to 14, the TiN intermediate film having the predetermined film thickness is formed on the wafer 200 by performing the cycle at least once by employing the ALD method. In this case, in each of the cycles, it is necessary to perform the film formation by paying attention for preventing mixing of the atmosphere formed of the Ti-containing material gas in Step 11 and the atmosphere formed of the nitriding gas in Step 13 in the processing chamber 201 as described above. Also, the film thickness of the TiN intermediate film may be adjusted to 0.02 to 5 nm by controlling the number of cycles by the ALD method. The TiN film formed by the ALD method described above is a dense continuous film having a smooth surface.

After forming the TiN intermediate film by the ALD method, the heater 207 may preferably be controlled to maintain a temperature inside the processing chamber 201 to the predetermined temperature range of 600° C. to 700° C. A high temperature is preferable since the reaction is caused more easily with an increase in temperature, and the temperature is maintained to 700° C., for example. When the temperature and the like are stabilized after the temperature of the wafer reached to 700° C., the subsequent steps are executed as described below in a state where the temperature inside the processing chamber 201 is maintained to 700° C.

(Step 21)

In Step 21, $H_2$ is flown. The valve 334 of the gas supply piping 330 and the APC valve 243 of the evacuation piping 231 are simultaneously opened. $H_2$ is flown through the gas supply piping 330, and a flow rate thereof is adjusted by the mass flow controller 332. $H_2$ is evacuated through the evacuation piping 231 while being supplied to the processing chamber 201 through the gas supply openings 420*a* of the nozzle 420. In the case of flowing $H_2$, the APC valve 243 is appropriately adjusted to maintain a pressure inside the processing chamber 201 within a range of 50 to 1000 Pa, e.g. 60 Pa. A supply amount of $H_2$ controlled by the mass flow controller 324 is 1 to 20 slm. A time period for exposing the wafer 200 to $H_2$ is 10 to 1800 seconds. The temperature of the heater 207 is set to 700° C., for example, within a range of 600° C. to 700° C.

As described above, non-reacted Cl contained in the TiN intermediate film becomes HCl by performing the heat treatment with $H_2$ ($H_2$ annealing) to be released from the film, and a TiN film is formed.

A mechanism that Cl is released from the TiN intermediate film (a forecast mechanism) will hereinafter be described.

FIG. 5 is a diagram schematically showing the mechanism that Cl is released from the TiN intermediate film by the $H_2$ annealing.

Figure 5A:
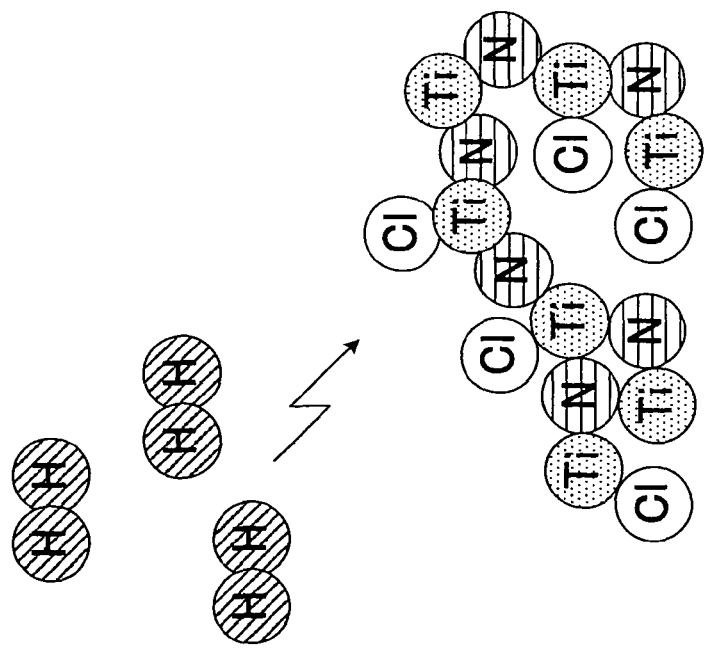
FIG. 5 is a diagram schematically showing a mechanism for Cl to be released from a TiN intermediate film by $H_2$ annealing.
Figure 5B:
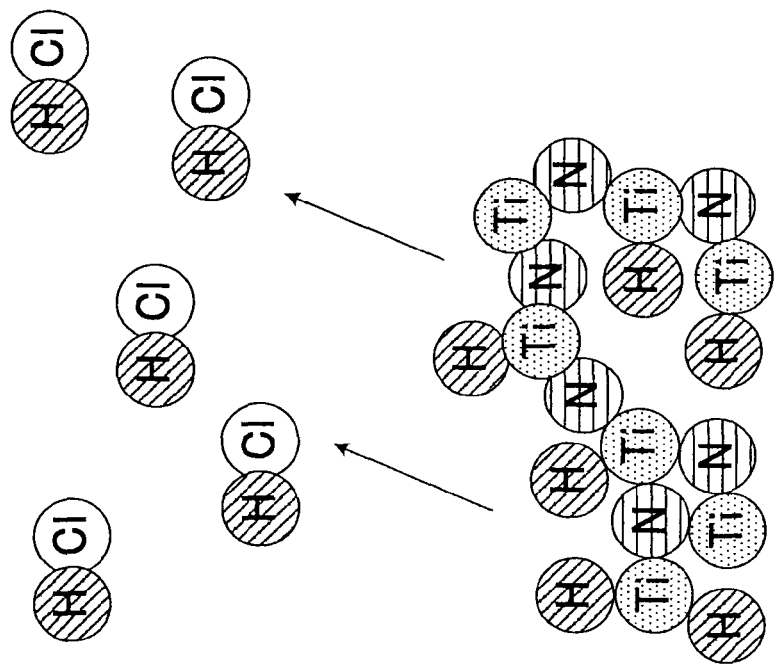

After the processings of Steps 11 to 14, the TiN intermediate film formed on the wafer 200 is in a state of containing Cl attributable to $TiCl_4$ used as the raw material (FIG. 5A). The $H_2$ annealing performed on the TiN intermediate film (Step 21) causes Cl contained in the TiN intermediate film to react with $H_2$, so that Cl becomes HCl to be released from the TiN intermediate film (FIG. 5B). Thus, Cl is removed from the TiN intermediate film, and the TiN film is formed.

The TiN film formed after the processing of Step 21 sometimes contains a TiNH film component containing H and having a Ti—N—H group in addition to the TiN film component having only the Ti—N—Ti bonding.

The reasons that the TiNH film component is contained are as follows. The TiN film is formed when the Ti—N—Ti bonding is formed by the releasing of H due to the formation of HCl through the reaction caused by collision between H of the Ti—N—H group and $TiCl_4$. However, when the reaction is not caused, the TiNH film is formed due to the remaining Ti—N—H group. It is considered that probability of formation of the TiN film is increased since the reaction is promoted with an increase in temperature. It is possible to remove Cl from the TiN film by performing Step 21 described above.

Also, as compared to the case of not performing the $H_2$ annealing, it is possible to reduce resistance (contact resistance) of the film to be formed as well as to improve a diffusion prevention (barrier) property by performing the $H_2$ annealing.

Step 21 may be performed after attaining the predetermined film thickness by performing Steps 11 to 14, or a metal film having the predetermined film thickness may be formed by performing Step 21 for each of cycles each consisting of Steps 11 to 14. In the case of forming the metal film having the predetermined film thickness by performing Step 21 for each of cycles each consisting of Steps 11 to 14 (i.e. in the case where the film thickness of the metal intermediate film is thin), it is preferable to perform Step 21 at the temperature same as that of Steps 11 to 14 without changing the temperature of Step 21 in the vertical apparatus.

Also, though the example of setting the temperature of the heater 207 in Steps 11 to 14 in such a manner as to keep the temperature of the wafer 200 to 450° C. is described in the above embodiment, the temperature of the wafer 200 may be a predetermined temperature between 300° C. to 550° C., and it is possible to change a concentration of remaining Cl by changing the temperature of the wafer 200. The temperature of the wafer 200 is increased in the case of reducing the concentration of remaining Cl, and the temperature of the wafer 200 is reduced in the case of increasing the concentration of remaining Cl.

Figure 6:
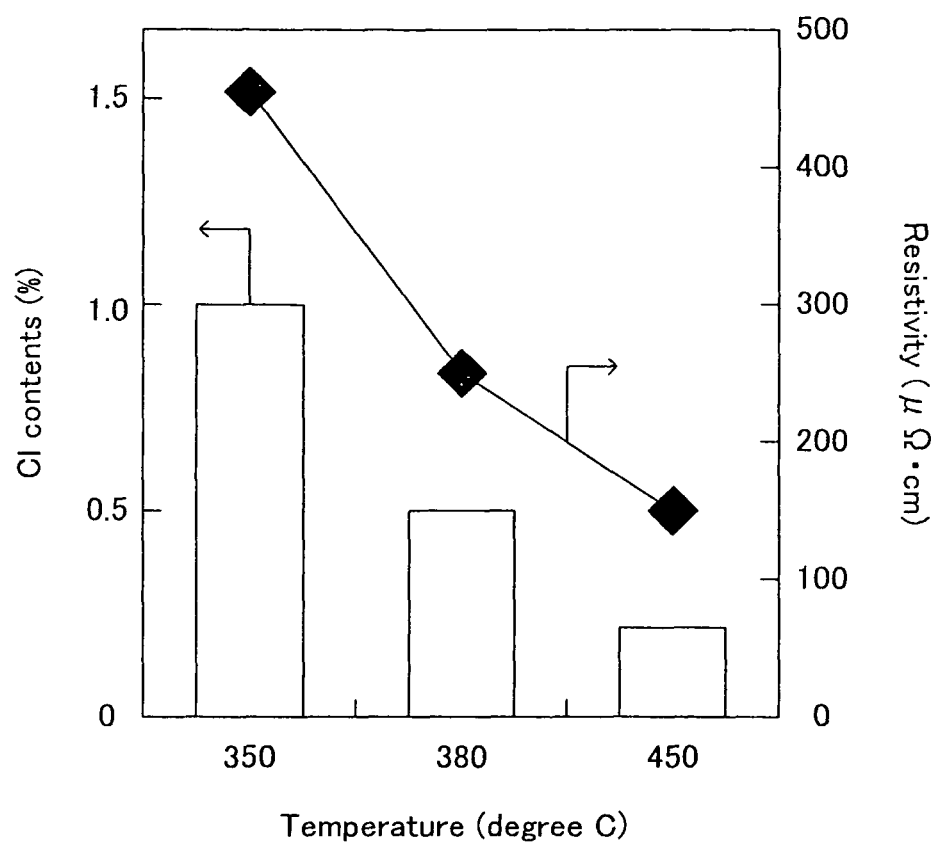
FIG. 6 is a diagram showing measurement results indicating relationships between a wafer processing temperature and a residual Cl concentration (%) and the wafer processing temperature and resistivity ($\mu\Omega cm$).

Shown in FIG. 6 are measurement results indicating relationships between the temperature of the wafer 200 (processing temperature) and the remaining Cl concentration (%) and between the temperature of the wafer 200 (processing temperature) and resistivity ($\mu\Omega cm$). In the description of FIG. 6, "temperature of wafer 200" indicates the temperature of the wafer 200 during the processings of Steps 11 to 14. Also, the remaining Cl concentration indicates the concentration of Cl remaining the TiN film formed on the wafer 200 after $H_2$ annealing (Step 21). The resistivity corresponds to resistance (contact resistance) on a boundary surface of wafer 200/TiN film.

The remaining Cl concentration changed in the following manner: 1% when the temperature of the wafer 200 was set to 350° C.; 0.5% when the temperature of the wafer 200 was set to 380° C.; and 0.2% when the temperature of the wafer 200 was set to 450° C.

The resistivity is reduced along with an increase in temperature of the wafer 200 within the range of 300° C. to 550° C.

As shown in FIG. 6, the resistivity changed in the following manner: 460 $\mu\Omega cm$ when the temperature of the wafer 200 was set to 350° C.; 240 $\mu\Omega cm$ when the temperature of the wafer 200 was set to 380° C.; and 150 $\mu\Omega cm$ when the temperature of the wafer 200 was set to 450° C.

It is possible to change the concentration of remaining Cl also by changing the supply amount of $NH_3$. For example, the gas supply amount of $NH_3$ is reduced in the case of increasing the concentration of remaining Cl.

It is possible to change the concentration of remaining Cl also by changing the supply time period of $NH_3$. For example, the supply time period of $NH_3$ is reduced in the case of increasing the concentration of remaining Cl.

Second Embodiment

In the present embodiment, a method for forming a TiN film as a metal compound film by employing a CVD method will be described. One example of forming the TiN film (including TiNH film having a Ti—N—H group in some cases) on a substrate by forming a TiN intermediate film on the substrate while causing a bonding branch that has not undergone a substitution reaction to partially remain by using $TiCl_4$ that is Ti-containing material as a Cl-containing material compound and $NH_3$ as a nitriding gas (a reactive gas that reacts with $TiCl_4$) for substituting $TiCl_4$ and, subsequently, causing hydrogen to react with the bonding branch will be described. The difference with the first embodiment is that the TiN intermediate film is formed by the ALD method in the first embodiment, while the TiN intermediate film is formed by the CVD method in the present embodiment. Only the difference will be described. The substrate processing apparatus and the like that is suitably used in the present invention is the same as that of the first embodiment.

For deposition of a TiN film by the CVD method, the controller 280 controls the valves, the mass flow controllers, the vacuum pump, and the like in such a manner that $TiCl_4$ and $NH_3$ are supplied to the processing chamber 201 to generate a timing at which $TiCl_4$ and $NH_3$ are simultaneously present in the processing chamber 201 for causing a vapor reaction (CVD reaction). Hereinafter, a specific film formation sequence will be described.

In the present step, $TiCl_4$ and $NH_3$ are simultaneously flown. $TiCl_4$ is flown through the gas supply piping 310, and a carrier gas ($N_2$) is flown through the carrier gas supply piping 510. The valve 314 of the gas supply piping 310, the valve 512 of the carrier gas supply piping 510, and the APC valve 243 of the evacuation piping 231 are simultaneously opened. The carrier gas is flown through the carrier gas supply piping 510, and a flow rate thereof is adjusted by the mass flow controller 512. $TiCl_4$ is flown though the gas supply piping 310, and a flow rate thereof is adjusted by the mass flow controller 312. $TiCl_4$ is vaporized by the vaporizer 700 and mixed with the flow rate adjusted-carrier gas, followed by supply to the processing chamber 201 through the gas supply openings 410a of the nozzle 410.

$NH_3$ is flown through the gas supply piping 320, and a carrier gas ($N_2$) is flown through the carrier gas supply piping 520. The valve 324 of the gas supply piping 320, the valve 522 of the carrier gas supply piping 520, and the APC valve 243 of the evacuation piping 231 are simultaneously opened. The carrier gas is flown through the carrier gas supply piping 520, and a flow rate thereof is adjusted by the mass flow controller 522. $NH_3$ is flown though the gas supply piping 320, and a flow rate thereof is adjusted by the mass flow controller 322. $NH_3$ is mixed with the flow rate adjusted-carrier gas, followed by supply to the processing chamber 201 through the gas supply openings 420a of the nozzle 410.

$TiCl_4$ and $NH_3$ supplied to the processing chamber 201 are evacuated through the evacuation piping 231. In this case, the APC valve 243 is appropriately adjusted to maintain a pressure inside the processing chamber 201 within a range of 10 to 30 Pa, e.g. 20 Pa.

A supply amount of $TiCl_4$ controlled by the mass flow controller 312 is 0.1 to 1.0 g/min. In the case where the $TiCl_4$ supply amount is more than 1.0 g/min, an excessive vapor phase reaction is caused to deteriorate in-plane uniformity or to increase a generation of particles as compared to the case wherein the supply amount is within the above-specified range. In the case where the $TiCl_4$ supply amount is less than 0.1 g/min, the in-plane uniformity is deteriorated as compared to the case wherein the supply amount is within the above-specified range.

A supply amount of $NH_3$ controlled by the mass flow controller 322 is 0.1 to 0.5 slm. In the case where the $NH_3$ supply amount is more than 0.5 slm, an excessive vapor phase reaction is caused to deteriorate the in-plane uniformity or to increase a generation of particles as compared to the case wherein the supply amount is within the above-specified range. In the case where the $NH_3$ supply amount is less than 0.1 slm, the in-plane uniformity is deteriorated as compared to the case wherein the supply amount is within the above-specified range.

As a time period for exposing the wafer 200 to $TiCl_4$ and $NH_3$, the exposure is performed until a predetermined film thickness is attained.

The temperature of the heater 207 is so set as to keep the temperature of the wafer 200 within a range of 300° C. to 550° C., e.g. 450° C. In the case where the temperature of the wafer 200 is higher than 550° C., the raw materials supplied to the wafer 200 are heat-decomposed to make it difficult to ensure the in-plane uniformity. In the case where the temperature of the wafer 200 (processing chamber 201) is lower than 300° C., impurities remaining in the film to be formed is increased.

Here, the gases flown to the processing chamber 201 are $TiCl_4$, $NH_3$ and the inert gas such as $N_2$ and Ar. Therefore, $TiCl_4$ and $NH_3$ cause a vapor phase reaction (heat CVD reaction) to deposit a TiN intermediate film having a predetermined film thickness on a surface of the wafer 200 or a base film. In this case, remaining branches of Ti and Cl that have not undergone a substitution reaction remain on the formed TiN film.

After a predetermined processing time period has passed, the valve 314 of the gas supply piping 310 and the valve 324 of the gas supply piping 320 are closed to stop the $TiCl_4$ and $NH_3$ supplies. In this case, the APC valve 243 of the gas evacuation piping 231 is left open to evacuate the processing chamber 201 to 20 Pa or less by the vacuum pump 246, thereby releasing remaining $TiCl_4$ and $NH_3$ from the processing chamber 201. In this case, it is possible to enhance the effect of releasing the residual $TiCl_4$ and $NH_3$ by supplying the inert gas to the processing chamber 201 with the valve 514 of the gas supply piping 510 and the valve 524 of the gas supply piping 520 being opened.

A film thickness of the TiN film by the CVD method is adjusted by a supply time period. It is possible to increase the film thickness with an increase in supply time period, and it is possible to reduce the film thickness with a reduction in supply time period.

After forming the TiN intermediate film by the CVD method, the temperature inside the processing chamber 201 is increased, and $H_2$ is supplied to the processing chamber 201. Processing conditions and the like are the same as those of the first embodiment.

As described above, non-reacted Cl contained in the TiN intermediate film becomes HCl to be released from the film, and a TiN film is formed. The formed TiN film in some cases contains a TiNH film component containing H and having a Ti—N—H group in addition to the TiN film component having only the Ti—N—Ti bonding.

It is possible to change a concentration of remaining Cl by changing the temperature of the wafer 200. The temperature of wafer 200 is increased in the case of reducing the concentration of remaining Cl, and the temperature of the wafer 200 is reduced in the case of increasing the concentration of remaining Cl.

It is possible to change a concentration of remaining Cl also by changing the $NH_3$ supply amount. The $NH_3$ supply amount is increased in the case of reducing the concentration of remaining Cl, and the $NH_3$ supply amount is reduced in the case of increasing the concentration of remaining Cl.

It is possible to change a concentration of remaining Cl also by changing the NH$_3$ supply time period. The NH$_3$ supply time period is increased in the case of reducing the concentration of remaining Cl, and the NH$_3$ supply time period is reduced in the case of increasing the concentration of remaining Cl.

Since the TiN film and the like formed by the CVD method grow at a higher speed as compared to the TiN film formed by the ALD method, it is possible to reduce the time required for obtaining the desired film thickness.

Though the method for forming the TiN intermediate film by employing the CVD method by supplying TiCl$_4$ and NH$_3$ simultaneously and continuously to the processing chamber 201 is described in the second embodiment, the formation of the TiN intermediate film according to the second embodiment and a high temperature processing may be performed intermittently (pulse). By such method, quality of a film layer formed by the CVD method is improved, for example, resistivity of the film layer is reduced.

At an interface (joining part) with the base substrate, a bonding branch with a constituent element of the base film is simultaneously formed when H$_2$ is caused to react with a bonding branch that has not undergone a substitution reaction after forming a film by partially leaving the bonding branch. Examples of the substance among the constituent elements of the base layer to react with hydrogen include Si, SiGe, an Al alloy, Cu, a Cu alloy, and the like. In the case where Si is included among the constituent elements of the base layer, a Ti—Cl—Si bonding to which Cl intervenes at the interface has high resistivity. The metal compound film after removing Cl by using H$_2$ becomes a Ti$_x$Si$_y$N$_z$ film.

Also, though H$_2$ joins the supply piping of NH$_3$ to be supplied from the nozzle of NH$_3$ in the foregoing embodiments, a nozzle for H$_2$ may be provided independently inside the processing chamber without limitation to the description. H$_2$ may be supplied through the existing nozzle or through a dedicated nozzle for H$_2$.

Also, though the step for performing the film formation with the bonding branch that has not undergone the substitution reaction partially remaining and the step for removing remaining Cl by using H$_2$ are performed in the identical processing chamber or substrate processing apparatus in the foregoing embodiments, the steps may be performed in different processing chambers or substrate processing apparatuses.

Further, in the case of supplying H$_2$ in the present invention, it is possible to supply H$_2$ to the processing chamber 201 after activating H$_2$ by using plasma, an electron beam, a filament electrode, or the like. Thus, it is possible to reduce the temperature of the wafer 200 when supplying H$_2$. Also, it is possible to apply the present invention to the utilization for a contact with Si, which requires a reduction in contact resistance with the base layer.

Though the example of forming the TiN film is described in the foregoing embodiments, the present invention is applicable to the film formation of a Hf-containing film or an Al-containing film in which a Cl-containing material such as hafnium chloride (HfCl$_4$), aluminum chloride (AlCl$_3$), and the like is used without limitation to the example.

The present invention is not premised on the vertical apparatus, and the present invention is applicable to a horizontal apparatus, for example. Also, the present invention is not premixed on the use of the batch type apparatus that processes a plurality of substrates at once and is applicable to a single wafer apparatus. In the case of the vertical apparatus, it is possible to utilize a structure wherein an internal tube having substantially the same diameter with a substrate exist in a reaction tube, and a gas is introduced between substrates positioned inside the internal tube from a lateral direction and evacuated from the lateral direction.

Preferred Embodiments

Hereinafter, preferred embodiments of the present invention will be described as additional references.

(Additional Reference 1)

According to one aspect of the present invention, there is provided a method of manufacturing a semiconductor device for forming a metal film, comprising a first step of forming a metal intermediate film on a substrate by supplying a Cl-containing metal compound and a reactive gas reacting with the Cl-containing metal compound to the substrate and controlling a processing condition for causing a bonding branch that has not undergone a substitution reaction to remain at a predetermined concentration at a part of the Cl-containing metal compound and a second step of substituting the bonding branch contained in the metal intermediate film by supplying H2 to the substrate, the first step and the second step being performed in this order.

(Additional Reference 2)

The processing condition may preferably be any one of a substrate heating temperature, a reactive gas supply amount, a reactive gas supply time period.

(Additional Reference 3)

The Cl-containing metal compound may preferably be TiCl$_4$; the reactive gas may preferably be NH$_3$; and the metal film may preferably be a TiN film.

(Additional Reference 4)

The TiN film may preferably contain a Ti—N—H group.

(Additional Reference 5)

The metal intermediate film may preferably be formed by alternately supplying the Cl-containing metal compound and the reactive gas.

(Additional Reference 6)

The metal intermediate film may preferably be formed by simultaneously supplying the Cl-containing metal compound and the reactive gas.

(Additional Reference 7)

A base layer of the substrate may preferably be any one of Si, SiGe, an Al alloy, Cu, and a Cu alloy.

(Additional Reference 8)

The base layer of the substrate may preferably be Si, and a Ti$_x$Si$_y$N$_z$ film may preferably be formed on a boundary surface between the substrate and the metal film.

(Additional Reference 9)

The substrate temperatures in the first step and the second step may preferably be different from each other.

(Additional Reference 10)

The first step and the second step may preferably be performed in an identical processing chamber.

(Additional Reference 11)

The first step and the second step may preferably be performed in different processing chambers.

(Additional Reference 12)

H$_2$ may preferably be activated by using anyone of plasma, an electron beam, and a filament electrode.

(Additional Reference 13)

According to another aspect of the present invention, there is provided a substrate processing apparatus comprising a processing chamber that houses a substrate, a heating system that heats the substrate, a first gas supply system that supplies a Cl-containing metal compound to the substrate, a second gas supply system that supplies a reactive gas reacting with the Cl-containing metal compound to the substrate, a third gas supply system that supplies $H_2$ to the substrate, an evacuation system that evacuates an atmosphere in the processing chamber, and a control unit that controls the heating system, the first gas supply system, the second gas supply system, the third gas supply system, and the evacuation system, wherein the control unit controls the heating system, the first gas supply system, the second gas supply system, the third gas supply system and the evacuation system such that a metal intermediate film is formed on the substrate by supplying the Cl-containing metal compound and the reactive gas to the substrate while the substrate is heated and controlling a processing condition for causing a bonding branch that has not undergone a substitution reaction to remain at a predetermined concentration at a part of the Cl-containing metal compound, and then a metal film is formed by substituting the bonding branch contained in the metal intermediate film by supplying $H_2$ to the substrate.

(Additional Reference 14)

The processing condition may preferably be any one of a substrate heating temperature, a reactive gas supply amount, a reactive gas supply time period.

(Additional Reference 15)

According to one aspect of the present invention, there is provided a semiconductor device formed by the above-described semiconductor device production method.

(Additional Reference 16)

According to one aspect of the present invention, there is provided a semiconductor device formed by the above-described substrate processing apparatus.

(Additional Reference 17)

According to yet another aspect of the present invention, there is provided a film formation method comprising forming a pure metal or a metal compound film on a substrate by causing either one of an inorganic metal compound and an organic metal compound to react with a first gas reactive to the metal compound, wherein the film formation is formed with a bonding branch that has not undergone a substitution reaction partially remaining and controlling a composition of the metal film compound by causing a second gas to react with the bonding branch as well as a film formation apparatus.

(Additional Reference 18)

The film formation may preferably be performed by an ALD method or a CVD method.

(Additional Reference 19)

The metal compound may preferably be $TiCl_4$; the first gas may preferably be $NH_3$; and the second gas may preferably be $H_2$.

(Additional Reference 20)

The metal compound film after the processing may preferably be $Ti_xN_y$ or $Ti_xN_yH_z$.

(Additional Reference 21)

According to yet another aspect of the present invention, there is provided a film formation method comprising forming a pure metal or a metal compound film on a substrate by causing either one of an inorganic metal compound and an organic metal compound to react with a first gas reactive to the metal compound, wherein the film formation is formed with a bonding branch that has not undergone a substitution reaction partially remaining and causing a second gas to react with the bonding branch and simultaneously forming a bonding branch with a constitution element of a base layer film as well as a film formation apparatus.

(Additional Reference 22)

The film formation may preferably be performed by an ALD method or a CVD method.

(Additional Reference 23)

The metal compound may preferably be $TiCl_4$; the first gas may preferably be $NH_3$; the second gas may preferably be $H_2$; and the element to be subjected to the reaction among the substances contained in the base layer is any one of Si, SiGe, an Al alloy, Cu, and a Cu alloy.

(Additional Reference 24)

The metal compound film after the processing may preferably be $Ti_xN_ySi_z$.

(Additional Reference 25)

The first reaction and the second reaction are preferably conducted at different temperature ranges.

(Additional Reference 26)

The first reaction and the second reaction are conducted in different processing chambers or by different processing apparatuses.

(Additional Reference 27)

According to yet another aspect of the present invention, there is provided a CVD film formation apparatus and an AL film formation apparatus, each of which is capable of independently controlling at least two types of reducing materials and introducing the reducing materials simultaneously or arbitrarily at different timings and flow rate into a reaction chamber.

(Additional Reference 28)

A plurality of substrates may preferably be processed at once.

(Additional Reference 29)

The gas in the second reaction may preferably be activated by using any one of plasma, an electron beam, and a filament electrode.

What is claimed is:

1. A method of manufacturing a semiconductor device for forming a metal film, the method comprising:

forming a metal intermediate film on a substrate by supplying a Cl-containing metal compound and a reactive gas reacting with the Cl-containing metal compound to the substrate and controlling a processing condition for causing a bonding branch that has not undergone a substitution reaction to remain at a predetermined concentration at a part of the Cl-containing metal compound, and substituting the bonding branch contained in the metal intermediate film by supplying $H_2$ to the substrate, the substituting of the bonding branch being performed in order after formation of the metal intermediate film.

2. The method of manufacturing a semiconductor device according to claim 1, wherein the processing condition is any one of a substrate heating temperature, a reactive gas supply amount, and a reactive gas supply time period.

3. The method of manufacturing a semiconductor device according to claim 1, wherein the Cl-containing metal compound is $TiCl_4$; the reactive gas is $NH_3$; and the metal film is a TiN.

4. The method of manufacturing a semiconductor device according to claim 1, wherein the metal intermediate film is formed by alternately supplying the Cl-containing metal compound and the reactive gas in the forming a metal intermediate film.

5. The method of manufacturing a semiconductor device according to claim 1, wherein the metal intermediate film is formed by supplying the Cl-containing metal compound and the reactive gas to a substrate at a timing such that the Cl-containing metal compound and the reactive gas exist on the substrate substantially simultaneously.

6. The method of manufacturing a semiconductor device according to claim 1, wherein the substrate heating temperatures in the forming a metal intermediate film and the substituting the bonding branch are different from each other.

7. The method of manufacturing a semiconductor device according to claim 1, wherein the forming a metal intermediate film and the substituting the bonding branch are performed in an identical processing chamber.

8. The method of manufacturing a semiconductor device according to claim 1, wherein the forming a metal intermediate film and the substituting the bonding branch are performed in different processing chambers.

9. The method of manufacturing a semiconductor device according to claim 1, wherein $H_2$ is activated by using any one of plasma, an electron beam, and a filament electrode.

10. The method of manufacturing a semiconductor device according to claim 1, wherein the process of forming the metal intermediate film and substituting the bonding branch after formation of the metal intermediate film is repeated until a metal film thickness becomes a predetermined film thickness.

11. The method of manufacturing a semiconductor device according to claim 4, wherein the metal intermediate film is formed by alternately supplying the Cl-containing metal compound and the reactive gas at a timing such that the Cl-containing metal compound and the reactive gas exist on a substrate substantially simultaneously.

12. The method of manufacturing a semiconductor device according to claim 4, wherein the metal intermediate film is formed by alternately supplying the Cl-containing metal compound and the reactive gas to a substrate such that the Cl-containing metal compound and the reactive gas are substantially simultaneously present on the substrate.

* * * * *